United States Patent [19]
Huff et al.

[11] Patent Number: 4,906,920
[45] Date of Patent: Mar. 6, 1990

[54] SELF-LEVELING MEMBRANE PROBE

[75] Inventors: Richard E. Huff, Belmont; Farid Matta, Mountain View, both of Calif.

[73] Assignee: Hewlett-Packard Company, Palo Alto, Calif.

[21] Appl. No.: 256,029

[22] Filed: Oct. 11, 1988

[51] Int. Cl.$^4$ .................. G01R 1/06; G01R 31/02
[52] U.S. Cl. .................. 324/158 P; 324/158 F; 324/73.1
[58] Field of Search ........... 324/158 F, 158 P, 73 PC, 324/73 AT; 439/482, 842

[56] References Cited

U.S. PATENT DOCUMENTS

| | | | |
|---|---|---|---|
| 4,636,722 | 1/1987 | Ardezzone | 324/158 P |
| 4,649,339 | 3/1987 | Grangroth et al. | 324/158 F |
| 4,751,457 | 6/1988 | Veenendaal | 324/158 F |
| 4,758,785 | 7/1988 | Rath | 324/73 PC |

Primary Examiner—Reinhard J. Eisenzopf
Assistant Examiner—Vinh P. Nguyen

[57] ABSTRACT

A self-leveling membrane probe [10] is disclosed. A carrier [12] supports a translation stage [18] through radial flexure pivots [14]. A flexible membrane [22] having a first and second side is stretched over the translation stage [28] and held in high tension across its central portion compared to the tension maintained in its outer portion. The membrane's [22] center of the first side faces a device under test (DUT) (not shown) and carries contact bumps [34] that relay electric signals in and out of the DUT. The second side opposite the contact bumps [34] is occupied by a receptacle [32] including a rotation plate [30] and a conical well [32b] designed to receive a pivot pin [26] enbedded in a reference plate [24] suspended from above by the translation stage [18]. The pin [26] and well [32b] function together as a bearing and provide an automatic compensating rotation in response to an alignment mismatch between the probe [10] and a device under test. When the contact bumps [34] encounter uneven test pads, one end of the rotation plate [30] is pushed upwards away from the test wafer. Since the pivot pin [26] is held in a constant vertical position by the fixed reference plate [24], the rotation plate [30] reacts to the imbalanced force applied from below by rotating about the pointed end [26a] of the pivot pin [26] which is seated at the bottom of the conical well [32b]. The resulting angular deflection of the rotation plate [30] aligns the contact bumps [34] on the membrane [22] to the inclined plane of the input-output pads.

3 Claims, 1 Drawing Sheet

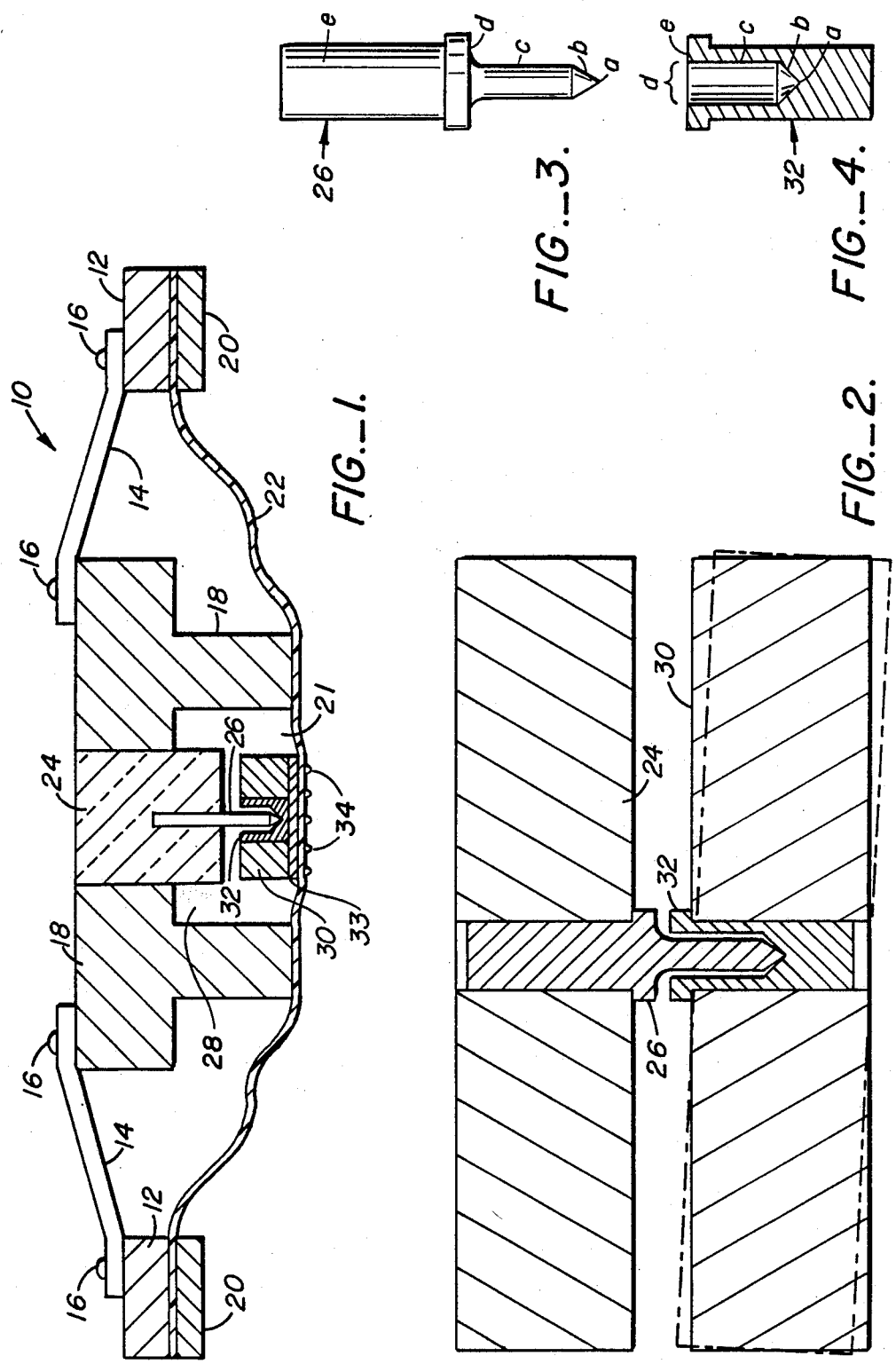

SELF-LEVELING MEMBRANE PROBE

CROSS-REFERENCE TO RELATED APPLICATIONS

This case is related to the following commonly assigned copending applications filed in the U.S. (1) Ser. No. 249,481 with a title "Force Delivery System for Improved Precision Membrane Probe", by Richard Huff and Brian Leslie, filed September 1988; (2) Ser. No. 249,474 with a title "Micro-Strip Architecture for Membrane Test Probe", Elizabeth A. Belloli et al., filed September 1988; (3) Ser. No. 250,458 with a title "Membrane Probe with Automatic Contact Scrub Action", by Richard Huff, filed September 1988; and (4) U.S. Ser. No. 07/013,484, (now abandoned) entitled "Mechanism to Self-Align the Plane of Test Probes to the Plane of Device Under Test", by Farid Matta, filed January 1987. These cases are hereby incorporated by reference into this present case.

BACKGROUND TECHNOLOGY

This field of this invention relates generally to the non-destructive testing of integrated circuits (IC's) in the electronics industry, and relates more particularly to high speed accurate testing of IC's using generally planar membrane test probe cards.

Non-destructive methods now exist for testing integrated circuits. Integrated circuits are generally grown or formed layer by layer as a plurality of semiconductor chips having input/output pads in large batches on thin planar substrates called wafers. Before the wafer is cut into individual chips, the circuits on each chip must be inspected and checked.

This testing operation is usually performed while the circuits still reside together on a single wafer, since testing after the dies have been sawn apart and packaged is prohibitively expensive. Hundreds of separate devices on every wafer are analyzed by passing input signals from a test probe, a planar test membrane or a planar membrane test card, into each device and monitoring voltage levels at selected output locations on the tiny circuits.

Each chip has test pads designed to electrically make contact with other devices. Because of height differences in these pads, conventional probe devices often make erroneous contact and thus produce inaccurate results. Large geometric and height discrepancies among these surface features cause faulty electrical connections between the test probe and the input/output pads of the device under test (DUT).

Specifically, the support structure carrying the test membranes cannot compensate for misalignment between the plane of the test probe membrane and the DUT. Because the test membrane cannot be aligned to be coplanar with the wafer bearing the many chips, the art of chip testing routinely experiences testing errors that preferably should be eliminated.

Because of this plane alignment problem, testers have had difficulty performing uniformly reliable tests at high speed with minimal test inaccuracy caused by irregularities in test pad height.

To solve these and other problems, the present invention offers method and apparatus for providing an automatic self-leveling action for a membrane probe card or membrane. The invention is used for providing high speed test signals to an integrated circuit array residing on a wafer.

This innovative technique enhances the performance of previous membrane probe card designs by reducing the incidence of inaccurate test results that are caused by the failure of the probe contacts to make a complete electrical coupling to the input/output pads of a device under test.

SUMMARY OF THE INVENTION

The self-leveling membrane probe claimed in this patent application overcomes the problem of unreliable test results, results caused by the failure of previous membrane probes to adapt to the irregular height of surface features presented by a test wafer.

The self-leveling membrane probe uses a pivot pin and conical receptacle that function together as a bearing. The bearing provides an automatic compensating rotation in response to an alignment mismatch between the probe and a device under test.

A set of flexure pivots suspended from a carrier holds a central translation stage which protrudes below the carrier; it is urged against a thin flexible membrane stretched across the bottom of the carrier. The side of the membrane which faces the device under test includes conductive contact bumps formed on the membrane that are lowered onto input-output pads on the test wafer.

The side of the membrane which is opposite the contact bumps is occupied by a receptacle comprising a rotation plate and a conical well. This conical well is designed to receive the pointed end of a pivot pin which is embedded in a fixed reference plate suspended over the pin by the translation stage.

When the contact bumps encounter a group of test pads that present an uneven surface to the probe, one end of the rotation plate is pushed upwards away from the test wafer. Since the pivot pin is held in a constant vertical position by the fixed reference plate, the rotation plate reacts to the imbalanced force applied from below by rotating about the pointed end of the pivot pin which is seated at the bottom of the conical well. The resulting angular deflection of the rotation plate aligns the contact bumps on the membrane to the inclined plane of the input-output pads.

BRIEF DESCRIPTION OF THE FIGURES

FIG. 1 is an example schematic representation of a structure made according to the claimed invention;

FIG. 2 is a partial schematic example structure of the present invention showing the automatic compensating action which maintains proper alignment of the membrane with a device under test;

FIGS. 3 and 4 are isolated schematic cross-sectional views of the pivot pin and receptacle examples made according to the claimed invention.

DETAILED DESCRIPTION OF A BEST MODE EXAMPLE EMBODIMENT

The claims define the Invention. The claimed Invention has a broad scope which can be embodied in many different specific example constructions.

In contrast, presented here in the Figures, the Detailed Description and the Abstract is but one single example construction made according to the Invention defined by the claims.

Of all the example structures that can be made according to the claims, the inventors consider the particular example structure discussed here to be the best mode example structure for practicing the claimed invention.

SYSTEM OVERVIEW

Broadly stated, FIG. 1 shows an overview of an example construction of a self-leveling membrane probe 10. Probe 10 is an apparatus for providing an automatic compensating action which results in a substantially parallel alignment of a membrane probe and a device under test (DUT).

Probe 10 includes an upper carrier 12 and a spring means 14 which couples the upper carrier 12 to a translation means 18. Also included is a flexible planar surface 22 coupled to both the support means 12 and to the translation means 18. The flexible planar surface 22 has a plurality of electrical contacts 34 for establishing an electrical connection to a device under test a special case of spring means (14) are flexure pivots (14).

Further included is a pivot means 26 coupled to the translation means 18. A socket means 32 adjoins the flexible planar surface 22 for receiving the pivot means 26 and for allowing the socket means 32 and rotation means 30 to move freely about the pivot means 26.

SYSTEM DETAIL

FIG. 1 is an example construction of a self-leveling membrane probe 10 made according to the claimed invention. Probe 10 is shown in a cross-sectional view.

An upper carrier 12 supports three flexure pivots 14 which are attached to both the upper carrier 12 and a translation stage 18 by connecting bolts 16. A lower carrier section 20 holds a thin flexible membrane 22 across a lower central aperture 21. This membrane 22 is maintained under relatively low tension in the outer region that extends between the lower carrier section 20 and the translation stage 18.

The inner region of membrane 22 that spans the central lower aperture 21 of translation stage 18 is held under relatively higher tension. A fixed reference plate 24 is bonded to the central and upper region of the translation stage 18. One end of a rigid pivot pin 26 is embedded in this reference plate 24. Both plate 24 and pivot pin 26 extend down toward membrane 22 into a central cavity 28 of the translation stage 18.

As best seen in FIG. 3, pivot pin 26 includes a point 26a, a conical end 26b, a shank 26c, a collar 26d, and a base 26e which is anchored in reference plate 24. The vertical axis of the pivot pin 26 extends parallel to its shank 26c from its pointed end 26a upward to its base 26e. This longitudinal axis is perpendicular to an ideal imaginary horizontal plane passing through the device under test.

A rotation plate 30 is held against membrane 22 by the downward force of pivot pin 26. Plate 30 surrounds a nested pivot pin receptacle 32 that includes a seat 32a, a conical well 32b, an inner wall 32c, an aperture 32d, and a flange 32e (See FIG. 4.) The rotation plate 30 is centered over the innermost section of membrane 22 directly opposite a plurality of contact bumps 34 which are forced down on the input-output pads of a device under test (not shown).

An elastomeric bed 33 is sandwiched between rotation plate 30 and membrane 22 and cushions the force of the probe 10 on the device under test. The reader is invited to refer to a commonly-owned and assigned U.S. patent application entitled "Micro-Strip Architecture for Membrane Test Probe", by Elizabeth A. Belloli et al., filed in September 1988, for a detailed description of the fabrication process used to form conductive signal traces, terminals, contact bumps, and vias on and through a flexible surface like membrane 22 in the present invention.

FIGS. 1 and 2 best illustrate the operation of the example self-leveling membrane probe 10 being illustrated here.

Contact bumps 34 are frequently unable to register evenly across the input-output pads on the device under test because the height of these pads above the wafer is irregular. If uncorrected, this misalignment would cause one side of the central region of membrane 22 which bears the contact bumps 34 to fail to couple to the test device.

Alternatively, the failure of the membrane 22 to impress the contact bumps 34 along a contact plane that is parallel to the wafer can produce such extreme forces that test pads on the integrated circuit may be destroyed.

The self-leveling membrane probe lo solves this problem by providing a membrane 22 whose orientation is controlled by the compensating deflection of rotation plate 30. If, for example, the left side of a device under test is higher than its right side (as viewed in FIG. 2), the contact bumps 34 above that higher target area will strike the device under test first and the corresponding end of the rotation plate 30 will be deflected upward. This rotation or tilting is illustrated in dashed lines in FIG. 2.

The unbalanced contact force produced by the disparate height of the test pads will be automatically balanced by a torque that acts about the pivot pin point 26a that remains fixed in a vertical position relative to nominal horizontal plane of the test wafer. The opposite end of the rotation plate 30 will travel downward toward the device under test until the section of the membrane 22 that bears the contact bumps 34 is parallel to the canted test pad surface. The magnitude of height errors that are corrected by this relatively small rotation is typically five to ten microns.

In this example, which is the preferred embodiment of the self-leveling membrane probe 10, both the fixed reference plate 24 and the rotation plate 30 are 0.120 inches (30.5 mm) high. The base 26e of the pivot pin is 0.047 inches (11.9 mm) wide. The distance from the tip 26a of the pivot pin is 0.055 inches (14.0 mm) from the surface of the rotation plate 30 that bears against the membrane 22.

This distance from the membrane to the pivot pin point must be relatively short so that membrane distortion is minimized and so that the rotation plate 30 may move freely in response to misalignment of the contact bumps 34 on a test device. The angle across the conical well 32b must be larger than the conical end of the pivot pin 26 for the pin to move freely in the well. Although the pivot pin 26 and conical well 32b are typically both made of stainless steel, they may be fabricated from other materials in situations which are limited to relatively light loads.

The pivot pin 26 and conical well 32b function as a low-friction and self-centering socket joint or bearing which allows high accuracy alignment to within 0.1 milliradian over a range of 10 milliradians. This extremely accurate compensating mechanism prevents the rotation plate 30 from sliding off center, especially when elevated temperatures reduce the tension in the membrane 22. The rotation plate 30 is designed to experience a maximum rotation or deflection from the horizontal of 2.14 degrees.

The self-leveling membrane probe is typically used in a stationary chuck while a test wafer is stepped beneath the probe on a moving chuck. This design provides a low cost yet highly reliable system that insures uniform contact of the probe on the test device. The automatic compensating action extends the useful lifetime of the contact bumps while minimizing damage to the wafers that are tested.

The foregoing Detailed Description gives specific details illustrating only one example of how to practice the much more broadly claimed invention. However, many other specific example structures can be made without departing from the spirit and scope of the appended claims that follow.

Therefore it is to be understood that (a) the Detailed Description narrowly describes a single specific example construction made according to the claims, whereas (b) the claims actually define the invention, the invention defined has a scope much broader than the narrow scope of the specific example described above, and the scope of the claimed invention encompasses many other feasible specific example constructions and equivalent constructions in addition to the one example given above.

The invention claimed is:

1. An apparatus for providing an automatic compensating action which causes a substantially coplanar alignment between a substantially flat membrane probe and a substantially flat device under test (DUT), the apparatus comprising:
   (a) a carrier means;
   (b) a translation means,
      (i) separated into at least an upper plate and a lower plate;
      (ii) the upper plate being rigidly joined to a lower surface portion of the translation means:
      (iii) the upper plate being formed to include a pivot means, extending away from the upper plate and toward the lower plate; and
      (iv) the lower plate defining within itself a socket sized and oriented to receive the pivot means;
   said carrier means being effective for supporting said translation means;
   (c) a spring means, formed for coupling together the support means and the translation means; and
   (d) a flexible substantially planar surface:
      (i) formed to be coupled to both the support means and to the translation means; and
      (ii) formed to have on an exterior surface a plurality of electrical contacts positioned for establishing at least one electric connection to a device under test;
   whereby the pivot means, when carried by the socket, wobbles to thereby allow the two plates to float with respect to each other, thereby allowing the membrane to float while in contact with a device under test to cause the membrane to wobble across the DUT to make electrical contact with each portion of the DUT.

2. A self-leveling membrane probe apparatus for correcting an alignment mismatch between a plurality of contact bumps and a plurality of corresponding input-output pads on a device under test, the apparatus comprising:
   (a) an upper carrier;
   (b) a translation stage defining within itself a lower central aperture;
   said upper carrier being effective for supporting said translation stage;
   (c) a plurality of flexure pivots attached to the upper carrier and to the translation stage;
   (d) a lower carrier;
   (e) a flexible membrane:
      (i) affixed to the lower carrier toward the periphery of the membrane;
      (ii) stretched across the lower central aperture of the translation stage from the lower carrier;
      (iii) the membrane being provided with a plurality of contact bumps for engaging a device under test;
   (f) a pivot pin embedded in the translation stage; and
   (g) a pivot pin receptacle positioned on a central surface of the membrane for holding the pivot pin and for allowing the receptacle and the central surface of the membrane to move freely about a vertical axis of the pivot pin.

3. A self-leveling membrane probe defined in claim 2, wherein the pivot pin receptacle includes:
   (a) a rotation plate that is pushed against the membrane on a side opposite from the contact bumps by the pivot pin; and
   (b) the pivot pin being held in a conical well carried within the rotation plate.

* * * * *